(12) United States Patent
Chen et al.

(10) Patent No.: US 12,176,320 B2
(45) Date of Patent: Dec. 24, 2024

(54) SEMICONDUCTOR STRUCTURE AND METHODS FOR BONDING TESTED WAFERS AND TESTING PRE-BONDED WAFERS

(71) Applicant: AP MEMORY TECHNOLOGY CORPORATION, Hsinchu County (TW)

(72) Inventors: Wenliang Chen, Hsinchu County (TW); Chien An Yu, Hsinchu County (TW)

(73) Assignee: AP MEMORY TECHNOLOGY CORPORATION, Hsinchu County (TW)

( * ) Notice: Subject to any disclaimer, the term of this patent is extended or adjusted under 35 U.S.C. 154(b) by 434 days.

(21) Appl. No.: 17/702,171

(22) Filed: Mar. 23, 2022

(65) Prior Publication Data

US 2022/0359456 A1    Nov. 10, 2022

Related U.S. Application Data

(60) Provisional application No. 63/186,623, filed on May 10, 2021.

(51) Int. Cl.
*H01L 21/66* (2006.01)
*H01L 21/48* (2006.01)
(Continued)

(52) U.S. Cl.
CPC ............ *H01L 24/80* (2013.01); *H01L 21/481* (2013.01); *H01L 22/14* (2013.01); *H01L 24/08* (2013.01); *H01L 24/09* (2013.01); *H01L 25/0657* (2013.01); *H01L 25/50* (2013.01); *H01L 2224/08145* (2013.01);
(Continued)

(58) Field of Classification Search
CPC ......... H01L 24/80; H01L 24/08; H01L 24/09; H01L 21/481; H01L 22/14; H01L 25/0657; H01L 25/50
See application file for complete search history.

(56) References Cited

U.S. PATENT DOCUMENTS

| 9,557,348 B2 | 1/2017 | Li et al. |
| 2003/0173668 A1* | 9/2003 | Downey ............... H01L 24/06 257/750 |

(Continued)

FOREIGN PATENT DOCUMENTS

TW    200616124 A    5/2006

*Primary Examiner* — Nathan W Ha
(74) *Attorney, Agent, or Firm* — WPAT, P.C.; Anthony King

(57) ABSTRACT

A method for bonding tested wafers is provided. The method includes the following operations. A first wafer having a first surface is received, and the first wafer includes a test pad and a conductive pad at the first surface of the first wafer and the test pad has a recess caused by a test probe and the conductive pad is electrically connected to the test pad. The first surface of the first wafer is planarized. A first hybrid bonding layer is formed over the first surface of the first wafer. The first wafer and a second wafer are bonded to connect the first hybrid bonding layer and a second hybrid bonding layer on the second water. A semiconductor structure and a method for testing pre-bonded wafers are also provided.

20 Claims, 14 Drawing Sheets

(51) Int. Cl.
*H01L 23/00* (2006.01)
*H01L 25/00* (2006.01)
*H01L 25/065* (2023.01)

(52) U.S. Cl.
CPC ............... *H01L 2224/09515* (2013.01); *H01L 2224/80001* (2013.01); *H01L 2924/1436* (2013.01)

(56) References Cited

U.S. PATENT DOCUMENTS

| | | |
|---|---|---|
| 2006/0022690 A1 | 2/2006 | Malantonio et al. |
| 2006/0186405 A1 | 8/2006 | Tanabe |
| 2009/0243118 A1* | 10/2009 | Akiba ..................... H01L 22/14 257/773 |
| 2011/0204357 A1* | 8/2011 | Izuha ..................... H01L 22/32 438/18 |
| 2013/0063173 A1* | 3/2013 | Zhang ..................... H01L 22/20 324/756.01 |
| 2017/0186732 A1* | 6/2017 | Chu ........................ H01L 24/24 |
| 2018/0277503 A1* | 9/2018 | Sasaki .................... B41J 2/1629 |
| 2019/0363079 A1* | 11/2019 | Thei ...................... H01L 23/481 |
| 2020/0035672 A1* | 1/2020 | Thei ...................... H01L 23/562 |
| 2020/0161277 A1* | 5/2020 | Lee ......................... H01L 25/50 |
| 2020/0357709 A1* | 11/2020 | Chen ...................... H01L 24/29 |
| 2020/0365593 A1* | 11/2020 | Chen ...................... H01L 24/06 |
| 2020/0402903 A1* | 12/2020 | Chen ...................... H01L 25/16 |
| 2021/0175192 A1* | 6/2021 | Mueller ................. H01L 24/03 |
| 2022/0246484 A1* | 8/2022 | Yokoi .................... H01L 23/522 |
| 2022/0302108 A1* | 9/2022 | Thei ...................... H01L 23/3192 |
| 2022/0320044 A1* | 10/2022 | Chuang ............. H01L 21/76898 |
| 2023/0034412 A1* | 2/2023 | Lu ....................... H01L 23/5283 |
| 2023/0117629 A1* | 4/2023 | Maruyama .......... H01L 27/1469 257/444 |
| 2023/0140675 A1* | 5/2023 | Kim ....................... H01L 22/32 257/48 |
| 2024/0222332 A1* | 7/2024 | Chuang ................. H01L 22/32 |

\* cited by examiner

SEMICONDUCTOR STRUCTURE AND METHODS FOR BONDING TESTED WAFERS AND TESTING PRE-BONDED WAFERS

PRIORITY CLAIM AND CROSS-REFERENCE

This application claims the benefit of prior-filed U.S. provisional application No. 63/186,623, filed May 10, 2021, and incorporates its entirety herein.

FIELD

The present disclosure relates to a semiconductor structure and method for bonding tested wafers, particularly, the disclosed semiconductor structure includes a test pad for wafer testing prior to being hybrid bonded with another wafer. The structure defect of the test pad induced by a test probe during the wafer testing is repaired by a planarizing structure, and thus the quality of hybrid bonding of the wafers can be ensured.

BACKGROUND

Testing the individual die at the wafer level often called probe or sort, which has been an integral part of the IC manufacturing process. In some practice, the system of wafer prober can be used for electrical testing of wafers in the semiconductor development and manufacturing process. During the electrical test, test signals from a measuring instrument or tester are transmitted to individual devices on a wafer via probe needles or a probe card and the signals are then returned from the device.

The result of the electrical test is mainly for evaluating the characteristics of prototype ICs, reliability evaluation, and defect analysis. Furthermore, in evaluating devices and processes, highly accurate measurement and evaluation of a test element group, comprising transistors, interconnections and other element devices for an IC, is conducted.

BRIEF DESCRIPTION OF THE DRAWINGS

Aspects of the present disclosure are best understood from the following detailed description when read with the accompanying figures. It is noted that, in accordance with the standard practice in the industry, various structures are not drawn to scale. In fact, the dimensions of the various structures may be arbitrarily increased or reduced for clarity of discussion.

DETAILED DESCRIPTION

Figure 1:
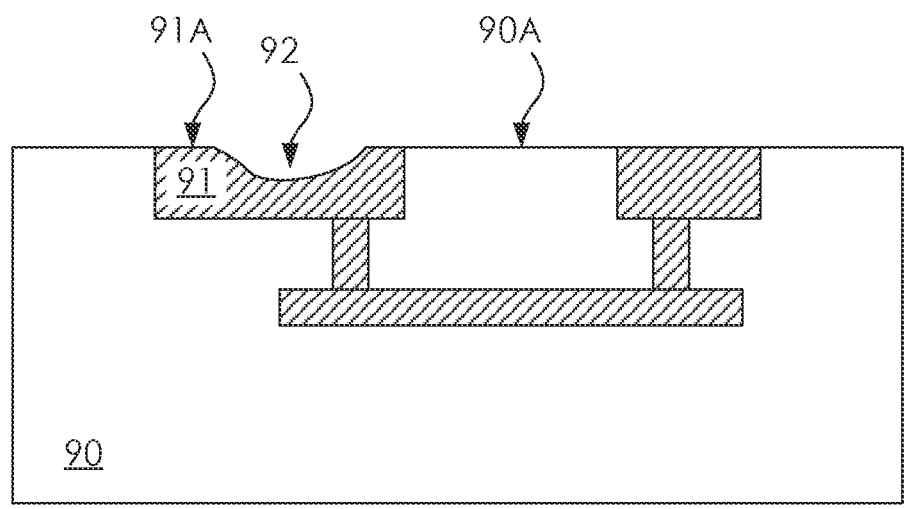
FIG. 1 illustrates a cross-sectional view of a tested wafer according to some comparative embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above", "upper", "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first", "second" and "third" describe various elements, components, regions, layers and/or sections, these elements, components, regions, layers and/or sections should not be limited by these terms. These terms may be only used to distinguish one element, component, region, layer, or section from another. The terms such as "first", "second", and "third" when used herein do not imply a sequence or order unless clearly indicated by the context.

In order to bond wafers and to ensure a high bandwidth therebetween, a hybrid bonding technique is a feasible approach in bonding these wafers. Accordingly, these wafers to be bonded can be manufactured by hybrid bonding operations performed on a wafer-on-wafer (WoW) or wafer-to-wafer packaging basis.

One of the requirements of the hybrid bonding technique is the flatness of the hybrid bonding layers in each of the wafers to be bonded. In the circumstances that the top surface of the wafers to be bonded is not flat enough, for example, if the flatness of the hybrid bonding layer is not enough, there will be "voids" or "bubbles" formed within the hybrid bonding structure, and thus the bonded wafers might be scrapped or be graded as sub-quality products.

Generally, the flatness of the hybrid bonding layers themselves can be achieved by the process control of the hybrid bonding technique; however, in case of the structure below the hybrid bonding layer is not flat, the profile of the hybrid bonding layer would be affected accordingly.

In other words, in typical practice in the semiconductor industry, it is avoided to perform the operations that might affect the flatness of the wafer prior to bonding the wafer with one another. For instance, it is avoided to implement an electrical test by a test probe to the wafer prior to the bonding operation, because the physical contact between the test probe and the surface of the wafer, i.e., a test pad at the surface of the wafer, could damage the flatness of the test pad. Referring to the example shown in FIG. 1, a probe mark 92 would be formed at a top surface 91A of a test pad 91 at a first surface 90A of a wafer 90. The probe mark 92 could have a structural feature of recess, trench, or concave that includes a regular or irregular dishing profile at the top surface 91A of the test pad 91. In some comparative embodiments, the depth of the probe mark 92 may greater than about 0.3 μm.

Therefore, traditionally, the electrical tests are performed after the waters are bonded, and thus the test pads are formed at the surface(s) of the bonded water that is not going to be further bonded with another wafer. However, without implementing an electrical test to the wafer prior to the bonding operation, it is hard to check the quality and the yield of the water, which means the quality and the yield of a single wafer can only be confirmed after another wafer is bonded thereon (if the single wafer is a portion of the bonded water structure).

A specific example is DRAM. A DRAM wafer (to be singulated in later operation) can be manufactured by bonding a logic wafer and at least a memory wafer thereon. In the scenario that the memory water is free from being tested prior to the bonding operation, the bonded DRAM wafer might be failed in the electrical test due to a defective memory wafer therein. That is, a good logic wafer could thus be wasted since the bonded DRAM wafer might have to be scrapped.

Accordingly, if the wafer to be bonded can be tested prior to the bonding operation, the manufacturer can thus evaluate whether to implement the bonding operation. For example, if there are only a few regions of the memory wafer failed in the electrical test, such memory wafer still can be bonded with a good logic wafer, while the known regions that failed in the electrical test can be weeded out during the later singulating operation, whereas the DRAM units formed in rest of the regions still can be sold. On the other hand, if the electrical test can be implemented in advance, the manufacturer can grade the levels of quality of the bonded wafer, instead of directly scrapping the memory wafer.

In some embodiments of the present disclosure, the method for bonding tested wafers, the method for testing prey-hybrid-bonded wafers, and the corresponding semiconductor structure are thus provided to overcome the inconvenience as abovementioned.

Figure 2:
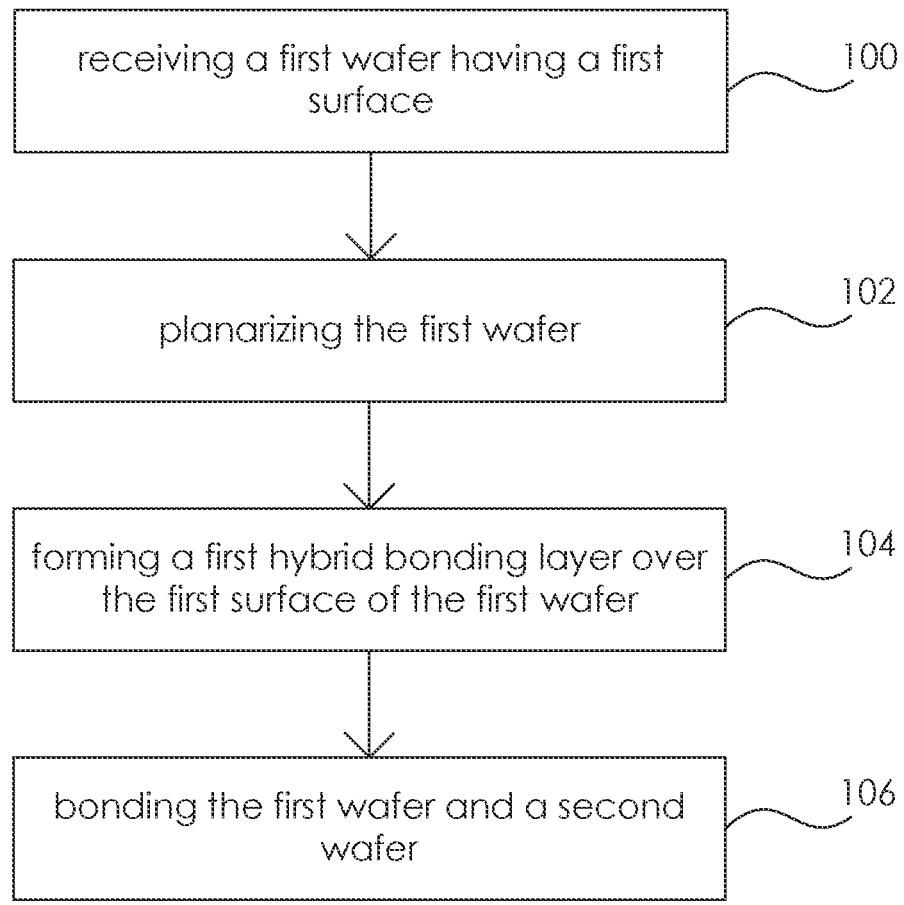
FIG. 2 illustrates a flow chart of a method for bonding tested wafers according to some embodiments of the present disclosure

Referring to FIG. 2, in some embodiments, the method for bonding tested wafers can include the operations as follows: an operation 100: receiving a first wafer having a first surface; an operation 102: planarizing the first wafer; an operation 104: forming a first hybrid bonding layer over the first surface of the first wafer; and an operation 106: bonding the first wafer and a second wafer. Furthermore, in the operation 100, the first wafer includes a test pad at the first surface of the first wafer and the test pad is configured to be in contact with the test probe; and in the operation 106, the first wafer and the second wafer can be bonded through a hybrid bonding technique to connect the first hybrid bonding layer and a second hybrid bonding layer on the second wafer.

Figure 3A:
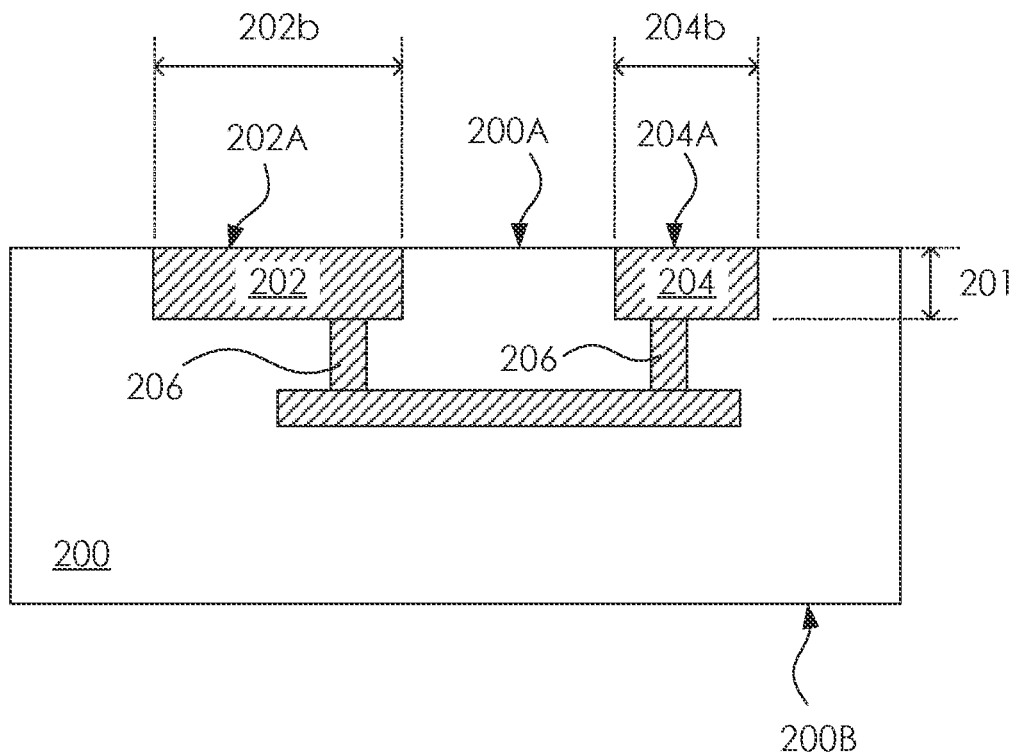
FIGS. 3A-3G illustrate cross-sectional views of a wafer according to some embodiments of the present disclosure.

Referring to FIG. 3A, in some embodiments, a first wafer 200 to be bonded has a first surface 200A and a second surface 200B opposite to the first surface 200A. The first wafer 200 includes at least a test pad 202 and at least a conductive pad 204 in proximity to the first surface 200A thereof. The top surfaces 202A, 204A of the test pad 202 and the conductive pad 204 are substantially leveled with the first surface 200A, In some embodiments, the test pad 202 and the conductive pad 204 are made by conductive materials such as copper, aluminum, or a combination thereof.

In some embodiments, the first wafer 200 can be a DRAM wafer that includes a plurality of device units, in other words, the first wafer 200 can includes a plurality of semiconductor devices therein. In some embodiments, the test pad 202 and the conductive pad 204 are portions of a top metal layer 201 of the first wafer 200. In the view of the semiconductor manufacturing process, the first water 200 can include a semiconductor substrate portion and a back-end-of-line (BEOL) structure, in which a front-end-of-line (FEOL) structure is formed in/on the semiconductor substrate portion that in proximity to the second surface 200B of the first wafer 200. According to such embodiments, the test pad 202 and the conductive pad 204 can be the topmost layers in the BEOL structure. In some embodiments, the test pad 202 and the conductive pad 204 are laterally surrounded by a dielectric material and the test pad 202 and the conductive pad 204 are electrically connected to each other, whereas the bottom surfaces of the test pad 202 and the conductive pad 204 are electrically connected to the interconnected structure in the BEOL structure and the transistor in the FEOL structure through at least a conductive via 206, respectively. Therefore, the test pad 202 can be used to evaluate the electrical performance of the semiconductor device connected thereto, and the conductive pad 204 can be used as a contact terminal of the semiconductor device.

To be more detailed, in some embodiments, even though the test pad 202 and the conductive pad 204 are both electrically connected to the semiconductor devices therebelow, these metal terminals can be distinguished by the physical dimensions thereof. Generally, the size of the test pad 202 should be larger than the size of the conductive pad 204 from a top view perspective so that it is much easier for landing a test probe on the test pad 202. As shown in the embodiment in FIG. 3A, a first width 202b of the test pad 202 is larger than a second width 204b of the conductive pad 204 from a cross sectional perspective. In some embodiments, the profile of the test pad 202 from a top view perspective is square. In some embodiments, the first width 202b is in a range of from about 20 μm to about 60 μm, which means the test pad 202 can be a square pad having a contact area from about 20×20 μm² to about 60×60 μm². In some embodiments, the second width 204b is in a range of from about 0.5 μm to about 20 μm. In some embodiments, the thicknesses of the test pad 202 and the conductive pad 204 can be in a range of from about 0.5 μm to about 1 μm.

Figure 3B:
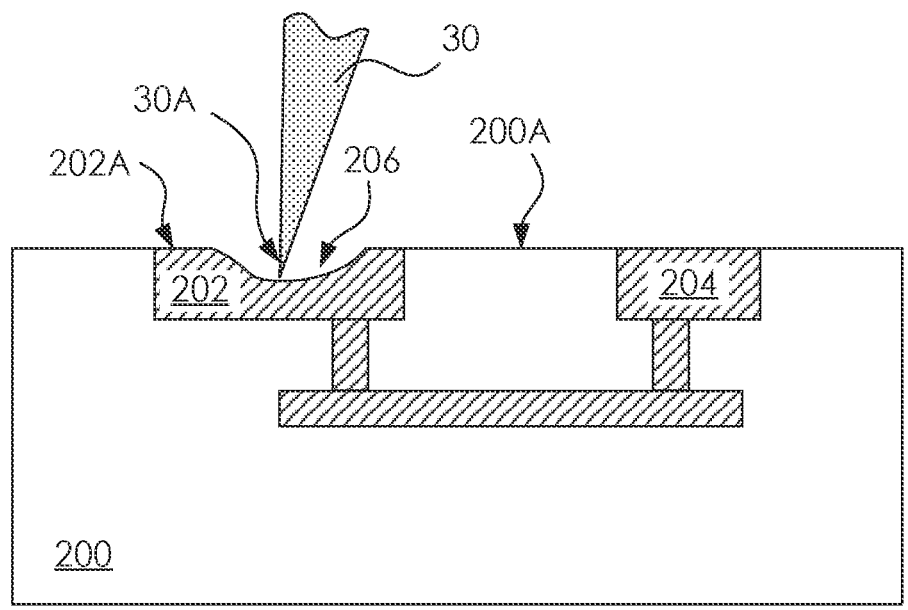

As previously mentioned in the operation 100, the test pad 202 is configured to receive a test probe or to be in contact with a test probe, and therefore in some embodiment, a testing operation can be implemented after receiving the first wafer 200. Referring to FIG. 3B, in some embodiments, an electrical test can be implemented to the first wafer 200 by landing a test probe 30 on the test pad 202 prior to planarizing the first surface 200A of the first water 200 (i.e., the operation 102). Such wafer-level electrical test can be implemented by the manufacturer of the first wafer 200, the service provider of wafer inspection, or the buyer of the first wafer 200.

During the wafer-level electrical test, the tip 30A of the test probe 30 can make physical contact with the test pad 202 of the first wafer 200, and a recess 206 could be thus formed. Like in the previous description in FIG. 1, the recess 206 is a probe mark, which could have a structural feature of recess, trench, or concave that includes a regular or irregular dishing profile at a top surface 202A of the test pad 202. The present disclosure here uses the term of "recess" to represent such structural feature. The depth of the recess 206 can be measured through metrology and inspection. In some embodiments, the depth of the recess 206 at the top surface 202A of the test pad 202 is in a range of from about 0.1 μm to about 0.3 μm. In other embodiments, the depth of the recess 206 at the top surface 202A of the test pad 202 is greater than about 0.3 μm.

Because the forming of the recess 206 is accompanied by the generation of metal particles or shards that spread over the first surface 200A of the first wafer 200, therefore in some embodiments, a cleaning operation can be implemented to remove these unwanted metal particles or shards before planarizing the first wafer 200.

Figure 3C:
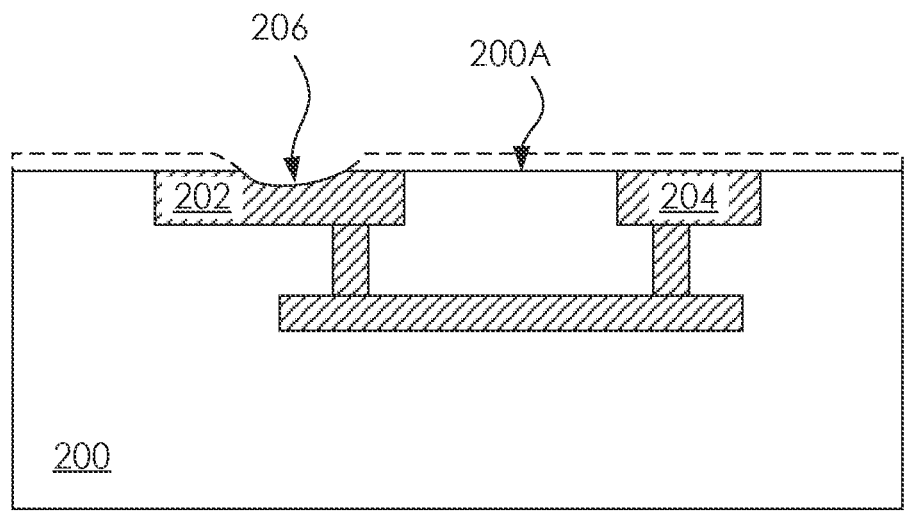

Referring to FIG. 3C, in some embodiments, the operation 102 (i.e., planarizing the first surface of the first wafer) can be performed by reducing the depth of the recess 206 at the test pad 204. In some embodiments, the depth reduction of the recess 206 is a thinning operation that can be implemented by using the techniques such as mechanical polishing, chemical-mechanical polishing (CMP), wet etching, dry etching, or combination thereof at the first surface 200A of the first wafer 200. In some embodiments, the depth of the recess 206 after planarizing the first surface 200A of the first wafer 200 is less than about 0.3 μm. In other words, in these embodiments, the depth of the recess 206 prior to the thinning operation is greater than about 0.3 μm, and the recess 206 with such a deep profile would induce a similar concave depression to the layers thereabove, thus the thinning operation should be implemented to reduce the depth of the recess 206 in advance. In some embodiments, the etching operation or the CMP operation to the first surface 200A of the first wafer 200 is implemented until the recess 206 at the top surface 202A of the test pad 202 is less than about 0.3 μm.

Figure 3D:
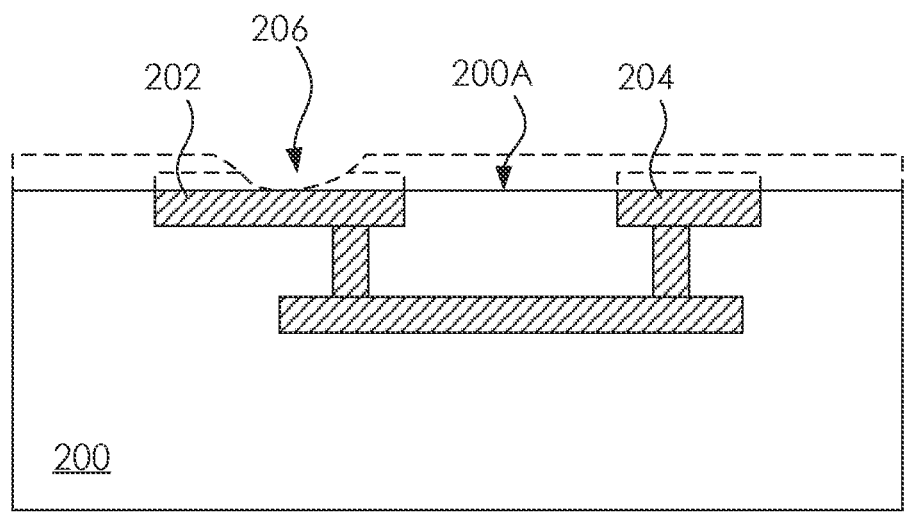

In some embodiments, as shown in FIG. 3D, by implementing the thinning operation, the recess 206 can be entirely removed, and a planar surface can be obtained thereby. In the circumstance that the depth of the recess 206 is not relatively shallow, it is possible to merely use a thinning operation to cure the structural defect formed by the test probe 30.

Figure 3E:
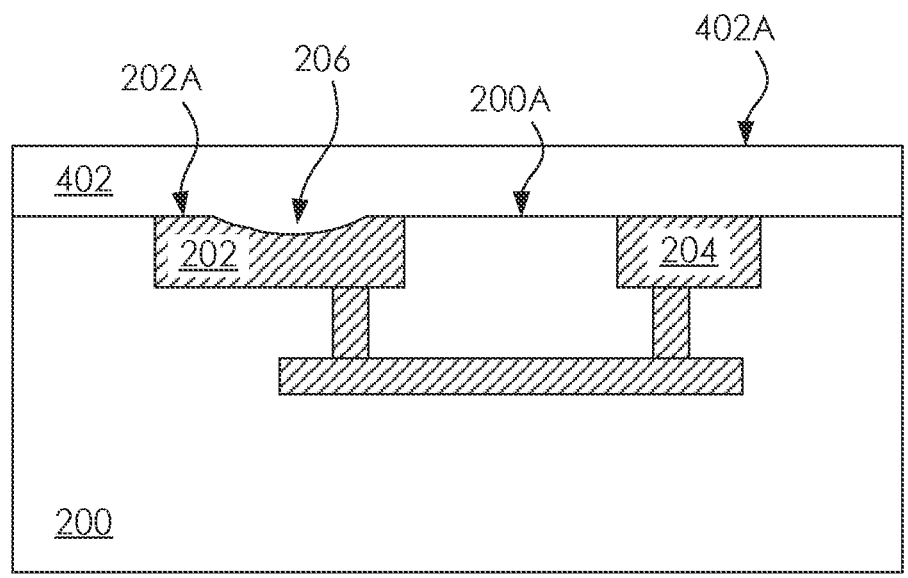

Referring to FIG. 3E, in other embodiments, the recess 206 formed by the test probe 30 is not as deep as that in the embodiments shown in FIG. 3C and therefore the thinning operation can be waived. For instance, in the scenario that the depth of the recess 206 at the top surface 202A of the test pad 202 is less than about 0.3 μm, the dishing profile of the recess 206 can be filled with an insulating material. In such embodiments, by implementing the operation 102, an insulating layer 402 can be formed over the first surface 200A of the first wafer 200. The insulating material of the insulating layer 402 can fill the recess 206 and provide a new planar surface 402A over the first surface 200A. In some embodiments, the insulating layer 402 is made by dielectric materials such as silicon oxide (SiO$_2$). In these embodiments, because the recess 206 at the top surface 202A of the test pad 202 is relatively shallow, it would not induce a similar concave depression to the layers thereabove, thus there is no need to implement the thinning operation in advance.

Figure 3F:
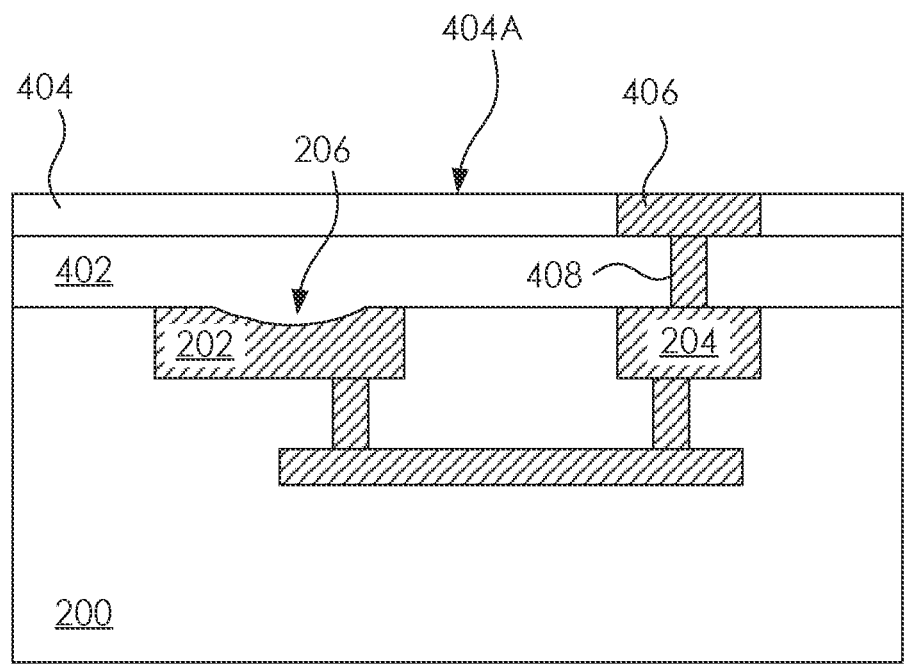

Referring to FIG. 3F, in some embodiments, a conductive pattern layer 404 can be formed over the insulating layer 402 and provide a new planar surface 404A. In some embodiments, the conductive pattern layer 404 includes a wiring pattern 406 that electrically connect to the conductive pad 204 through a conductive via 408 which penetrates the insulating layer 402. The wiring pattern 406 can further electrically connected to the hybrid bonding structure later shown in FIGS. 5B and 5C. The conductive via 408 can be formed through a via etching operation to form a via hole or an opening in the insulating layer 402, and then the via hole or the opening can be filled with conductive materials through an electroplating operation, furthermore, the wiring pattern 406 is laterally surrounded by an insulating material, and by combining with the insulating layer 402, a thick insulating structure can be formed over the test pad 202.

In other words, as shown in FIG. 3F, the topmost layers in the BEOL structure in the first wafer 200 can be altered from the conductive pad 204 to the wiring pattern 406 because the conductive path in the first wafer 200 is extended by the formation of the conductive via 408 and the wiring pattern 406. Meanwhile, the structure over the test pad 202 simultaneously becomes thicker. In some embodiments, the insulating material over the test pad 202 not only can fill the recess 206, or a recess of the test pad 202 referred herein, but also can provide a planar top surface because the insulating material over the test pad 202 is thick enough.

Moreover, because the first wafer 200 will further be bonded with another wafer through hybrid bonding technique, in the scenario that a hybrid bonding layer (will be disclosed later in FIGS. 4A-5C) is formed on the conductive pattern layer 404, the wiring pattern 406 can be an adequate landing structure for the hybrid contacts since the limitation of the aspect ratios of the hybrid contacts cannot allow the hybrid contacts directly landing on the conductive pad 204.

Figure 3G:
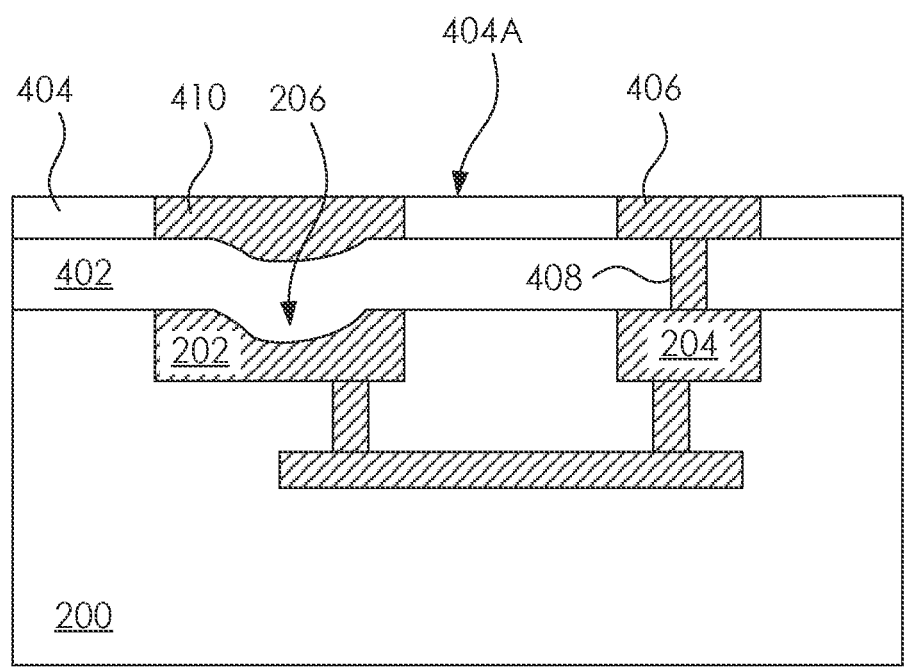

Referring to FIG. 3G, in some alternative embodiments, the conductive pattern layer 404 can have a dummy pattern 410 formed projectively over the test pad 202. The dummy pattern 410 can further electrically disconnected to the hybrid bonding structure later shown in FIG. 5C. In such embodiments, the recess 206 is still filled by the insulating material over the test pad 202, but if the profile of the top surface of the insulating material is still conformal to the profile of the recess 206 to a certain degree, the concave depression at the top surface of the insulating material would be filled by the dummy pattern 410. That is, the forming of the dummy pattern 410 is optional, wherein the depth of the recess 206 is the factor in determining whether to form the dummy pattern 410 in the conductive pattern layer 404. In the embodiments shown in FIGS. 3F and 3G, the top surface of the conductive pattern layer 404 is a planar surface that is adequate to form a hybrid bonding layer thereon.

On the other hand, even though a deep recess might be formed at the test pad 202 during the probe test process, the thinning operation that previously described in FIGS. 3C and 3D still can be waived if the insulating material over the recess 206 is thick enough (e.g., two insulating layers in a general BEM, structure) or the dummy pattern 410 is formed.

Furthermore, because the test pad 202 at the first surface 200A of the first wafer 200 is only for testing the electrical performance of the semiconductor devices in the first wafer 200, the test pad 202 does not need to be further electrically connected at the top surface thereof, thus the top surface 202A of the test pad 202 should be entirely covered by an insulating material (e.g., the insulating layer 402), and be free from contacting any conductive component of the hybrid bonding structure.

In some alternative embodiments, the dummy pattern 410 may not be merely floated over the test pad 202, for instance, some circuits not higher than the conductive pattern layer 404 may connected to the dummy pattern 410 to adjust the resistivity of the circuit.

Figure 4A:
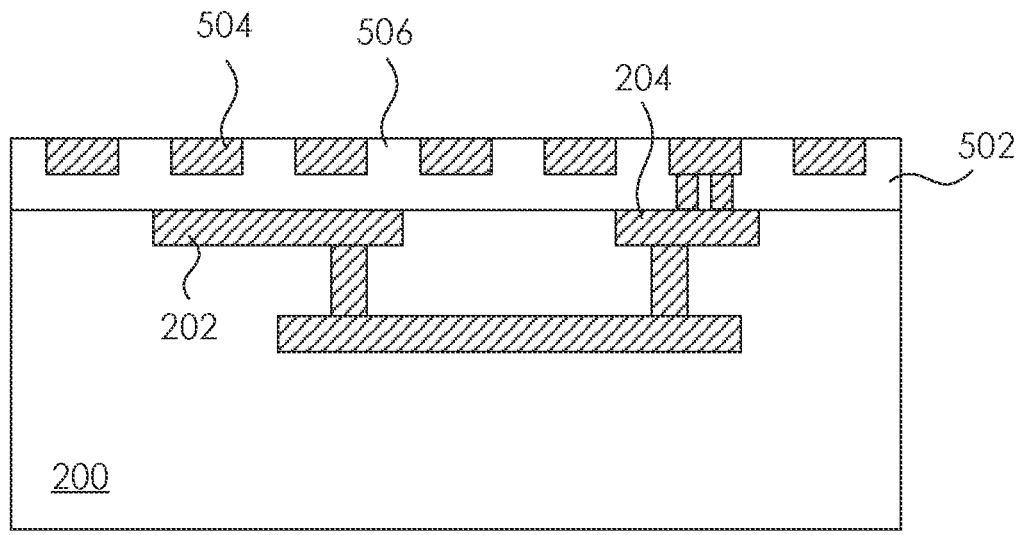
FIGS. 4A-4C illustrate cross-sectional views of a wafer according to some embodiments of the present disclosure.

The embodiments shown in FIG. 3D (or 3C), 3F, and 3G are different approaches that may be used to recover the flatness of the first wafer after the electrical test, and a planar surface for wafer bonding can be provided accordingly. Referring to FIGS. 4A, 48, and 4C, a first hybrid bonding layer 502 can be formed over the planar surface of the first wafer 200, wherein the planar surface is provided through different approaches that are disclosed in FIG. 3D (or 3C), 3F, and 3G, respectively.

Hybrid bonding is one of the wafer-on-wafer bonding technique which may connect two wafers by metal bonding and by oxide bonding at the same time; that is, allowing face-to-face or face-to-back, or back-to-back connections of wafers. In some embodiments, the first hybrid bonding layer 502 includes a plurality of bonding pads 504 at a bonding surface of the first hybrid bonding layer 502, while these bonding pads 504 are laterally surrounded by an oxide material 506.

In some embodiments, the bonding pads 504 are made by copper (Cu). In some embodiments, the oxide material 506 is made by dielectric materials such as silicon oxide ($SiO_2$). In order to robust Cu—Cu connection, the surface flatness of the bonding pads 504 should be well-controlled. For instance, in some embodiments, the surface of the Cu bonding pads may be controlled to be substantially coplanar to that of the $SiO_2$ portions by performing a chemical mechanical polishing (CMP) operation. Depending on the hybrid bonding operations, in some embodiments, the $SiO_2$ portions can be slightly protruding from the Cu bonding pads.

Figure 5A:
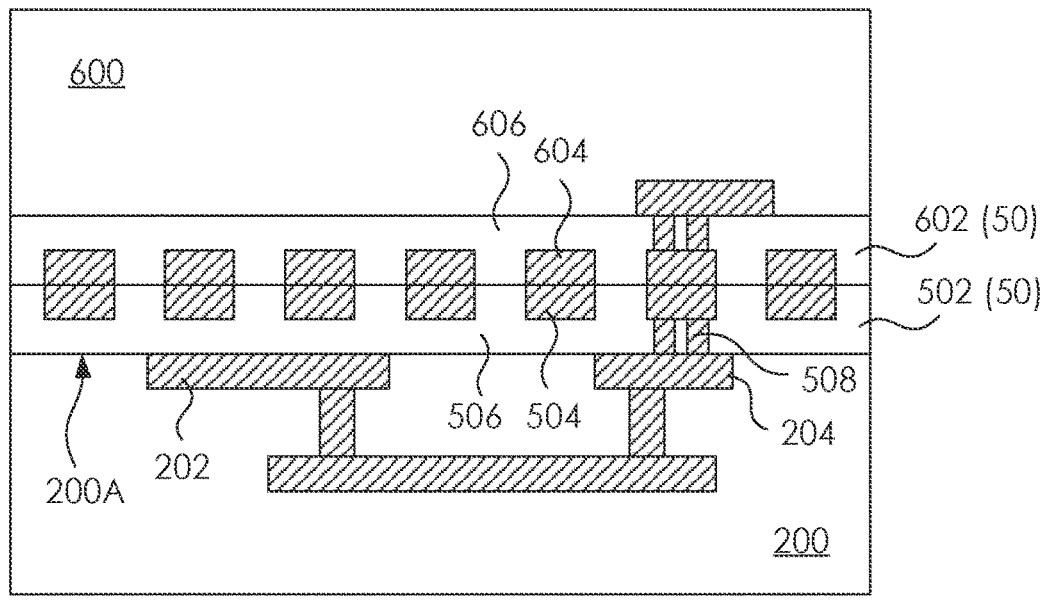
FIGS. 5A-5C illustrate cross-sectional views of a hybrid bonded wafer according to some embodiments of the present disclosure.

Referring to FIG. 5A, the first wafer 200 in the present disclosure can be hybrid bonded with a second wafer 600, wherein the second wafer 600 includes a second hybrid bonding layer 602 at a side thereof. The second hybrid bonding layer 602 includes a plurality of bonding pads 604 that laterally surrounded by an oxide material 606. In order to be well hybrid bonded with the first wafer 200, the distribution of the bonding pads 504 of the first hybrid bonding layer 502 is a mirror image of the distribution of the bonding pads 604 of the second hybrid bonding layer 602. The operations in forming the second hybrid bonding layer 602 on the second wafer 600 can be identical to the operations in forming the first hybrid bonding layer 502 on the first water 200, and once these hybrid bonding layers are prepared, the first wafer 200 and the second wafer 500 are thus ready to be hybrid bonded.

Figure 4B:
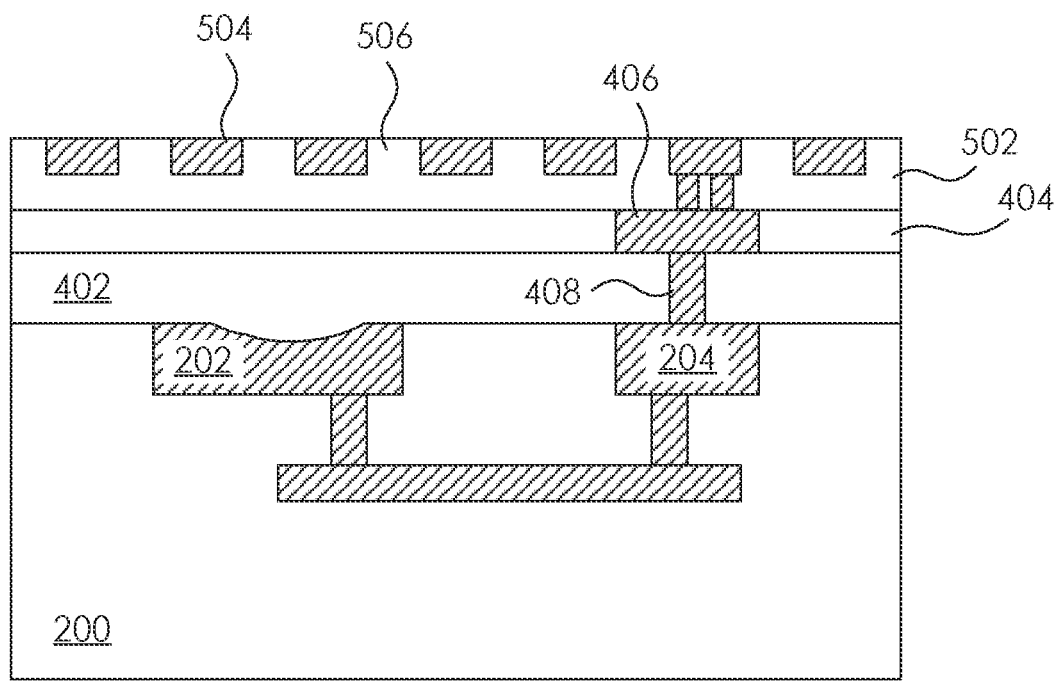
Figure 4C:
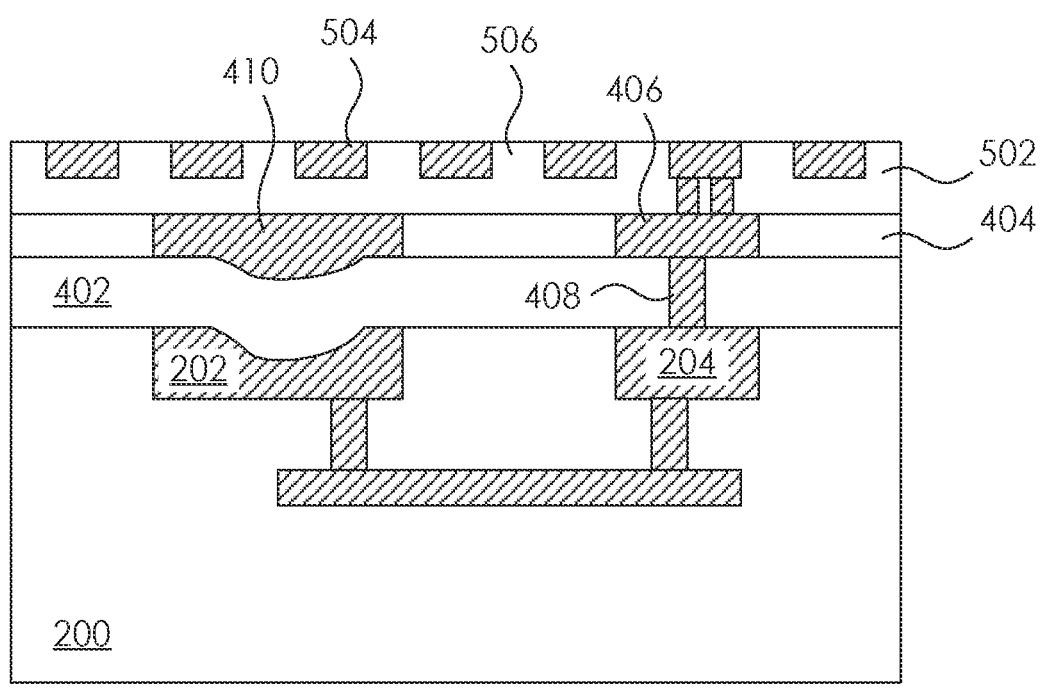
Figure 5B:
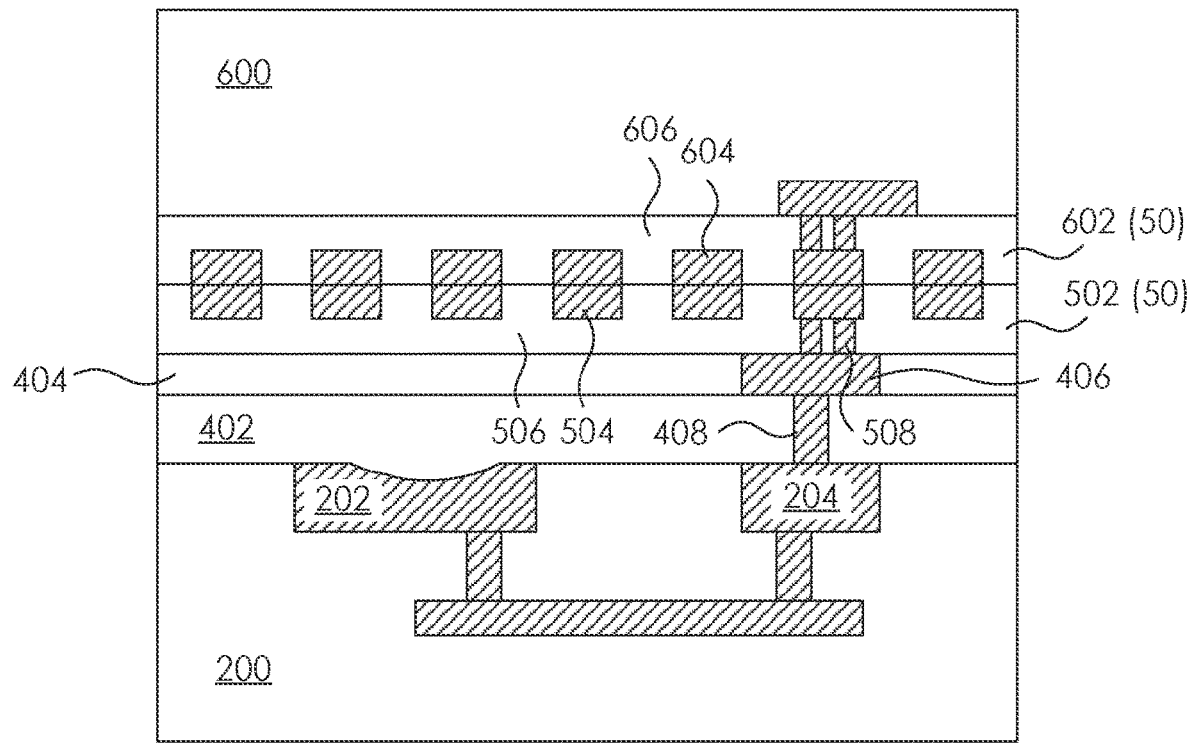
Figure 5C:
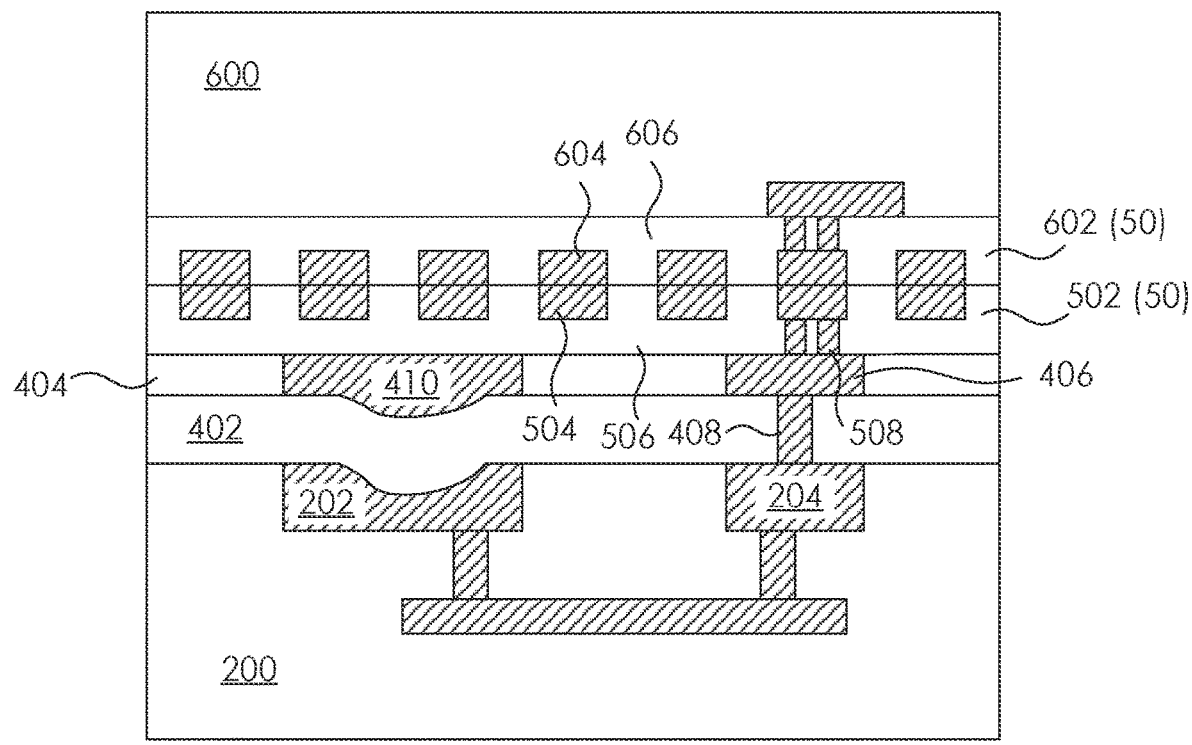

The first wafer 200 shown in FIG. 5A is the example that previously shown in FIG. 4A, and the first wafers 200 shown in FIGS. 5B and 5C are the examples that previously shown in FIGS. 4B and 4C, respectively, and the descriptions of the second wafer 600 in FIGS. 5B and 5C are omitted here for brevity.

In some embodiments, the first wafer 200 and the second wafer 600 are wafers with different functions. For example, the first wafer 200 can include a memory structure, and the second wafer 600 includes a logic structure. That is, in some embodiments, the second wafer 600 is a wafer with functional circuit, e.g. control circuit, and therefore the second wafer 600 can be called a logic wafer, or an active wafer; whereas the first wafer 200 is a DRAM wafer, or can be called a memory wafer or a capacitor wafer that the semiconductor devices in the first wafer 200 can be controlled by the functional circuits in the second wafer 600 through the electrical connection of hybrid bonding structure 50 (i.e., the first hybrid bonding layer 502 and the second hybrid bonding layer 602).

Still referring to FIG. 5A, in order to perform the electrical connection through the hybrid bonding structure 50, the first hybrid bonding layer 502 further includes a plurality of hybrid bonding contacts 508 between the bonding pads 504 and the conductive pad 204. In other words, the first hybrid bonding layer 502 includes a metal via structure connecting the bonding pads 504 and the conductive pad 204. Because the hybrid bonding contacts 508 can be designed to possess a small dimension (e.g., small diameter), to prevent connection defects caused by manufacturing operations, a plurality of hybrid bonding contacts 508 are formed to correspond to the bonding pads 504 and the conductive pad 204 (or the wiring pattern 406 in FIGS. 5B and 5C) in order to increase the production yield. Comparing with the space between the bonding pads 504 and the conductive pad 204 (or the wiring pattern 406 in FIGS. 5B and 5C), there is no hybrid bonding contact between the bonding pads 504 and the test pad 202 (or the dummy pattern 410 in FIG. 5C). The test pad 202 is used as a contact terminal in the electrical test prior to the hybrid bonding operation, and therefore the top surface of the test pad 202 can be entirely covered by the insulating material 506 and is free from further being in contact with other conductive component after the test is accomplished. On the other hands, due to the recess 206, the flatness of the top surface 202A of the test pad 202 might not adequate for the hybrid bonding contacts landing thereon for the purpose of electrical connection.

Figure 6A:
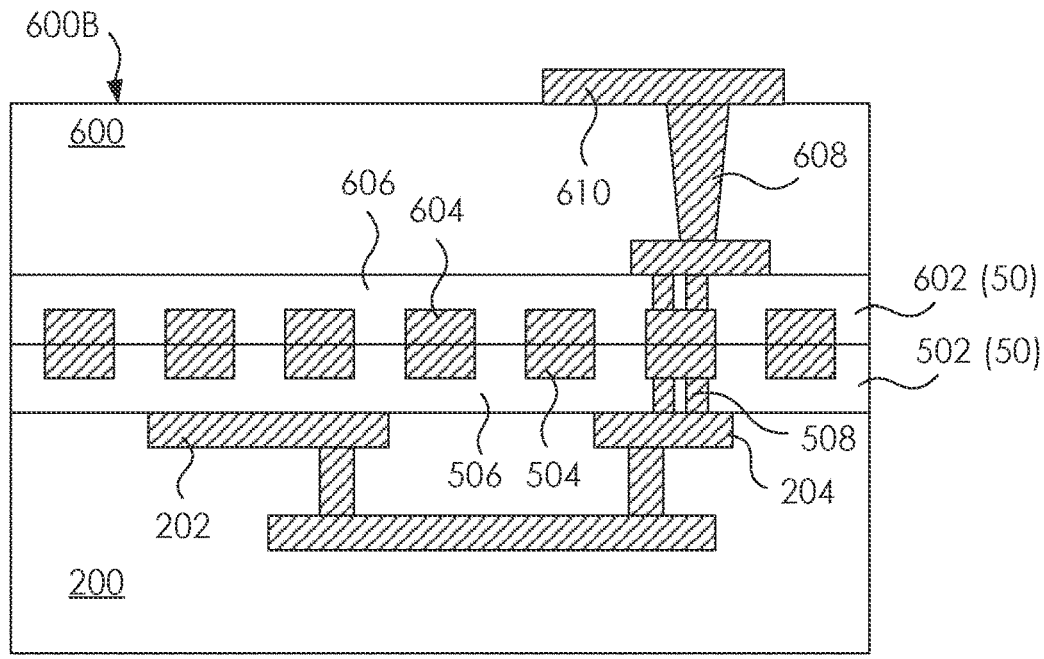
FIGS. 6A-6C illustrate cross-sectional views of a hybrid bonded wafer according to some embodiments of the present disclosure.

Referring to FIG. 6A, in some embodiments, the second wafer 600 includes a through silicon via. (TSV) 608 electrically connects the hybrid bonding structure 50 and a test pad 610 at a second surface 600B of the second wafer 600 away from the hybrid bonding structure 50. The test pad (or test ball) 610 at the second wafer 500 can be used to test the memory structure in the first wafer 200. In some embodiments, the function of the test pad 610 in the second wafer 600 is identical to the function of the test pad 202 in the first wafer 200 because the test pad 202 and the test pad 610 are both electrically connected to the same conductive path to the memory structure in the first wafer 200. Accordingly, after the hybrid bonding operation, the memory structure in the first wafer 200 still can be tested by using the test pad 610 at the second surface 600B of the second wafer 600 to see whether the electrical performance of the memory structure is affected by the thermal energy generated during the hybrid bonding operation.

Figure 6B:
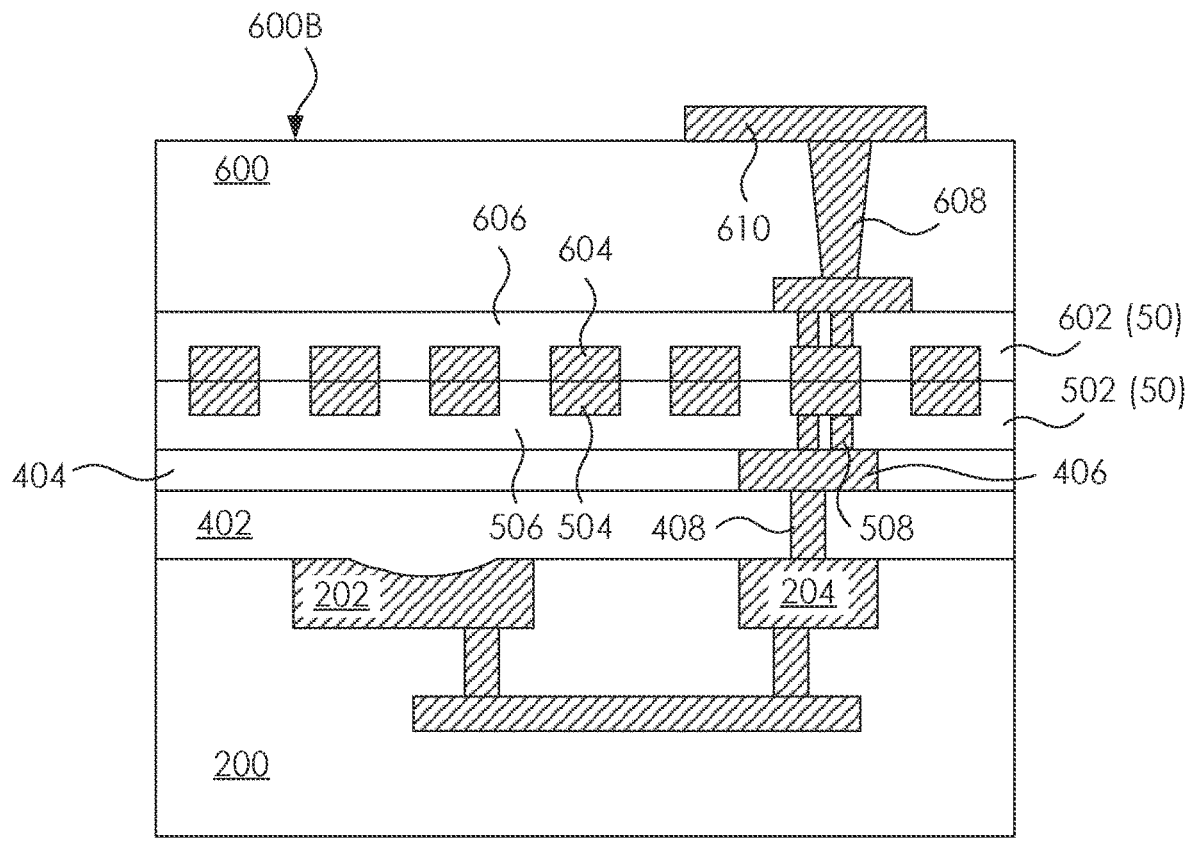
Figure 6C:
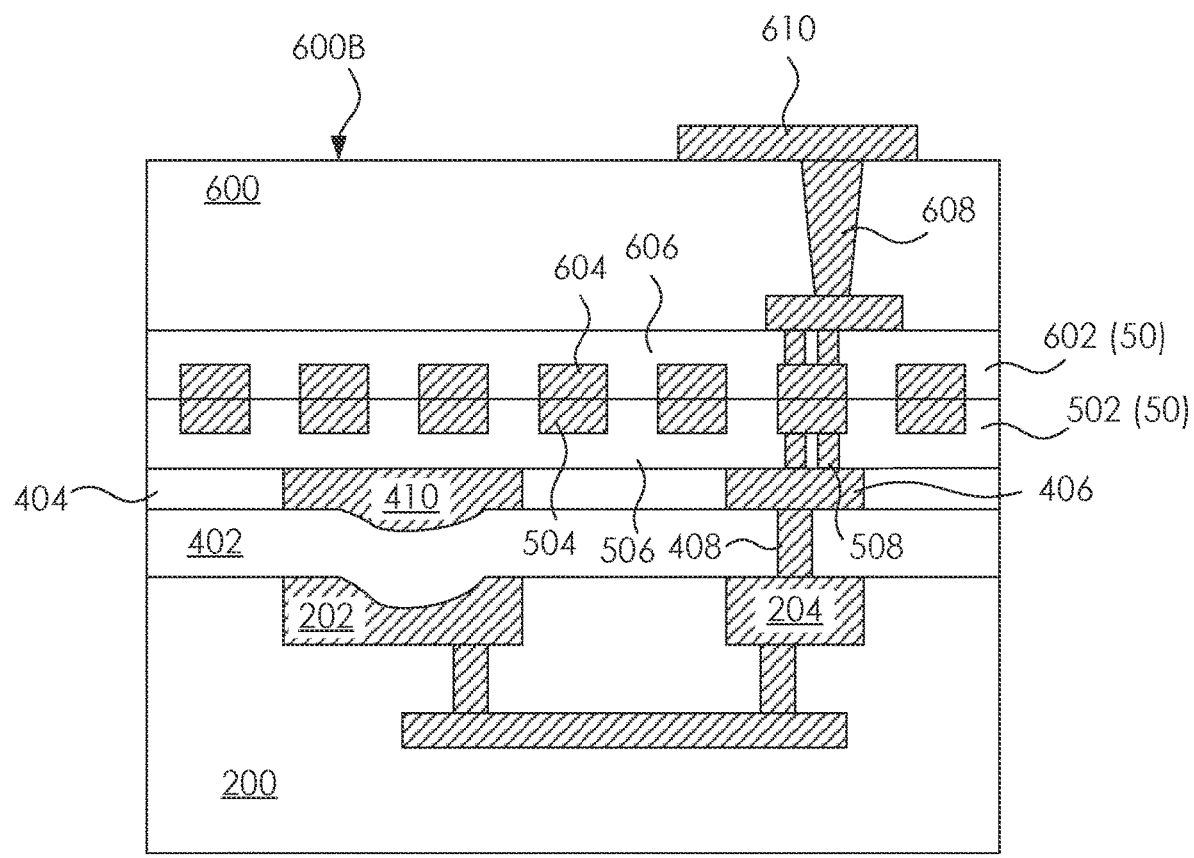

The first wafer 200 shown in FIG. 6A is the example that previously shown in FIG. 4A, and the first wafers 200 shown in FIGS. 6B and 6C are the examples that previously shown in FIGS. 4B and 4C, respectively, and the descriptions of the second wafer 600 in FIGS. 613 and 6C are omitted here for brevity.

Figure 7:
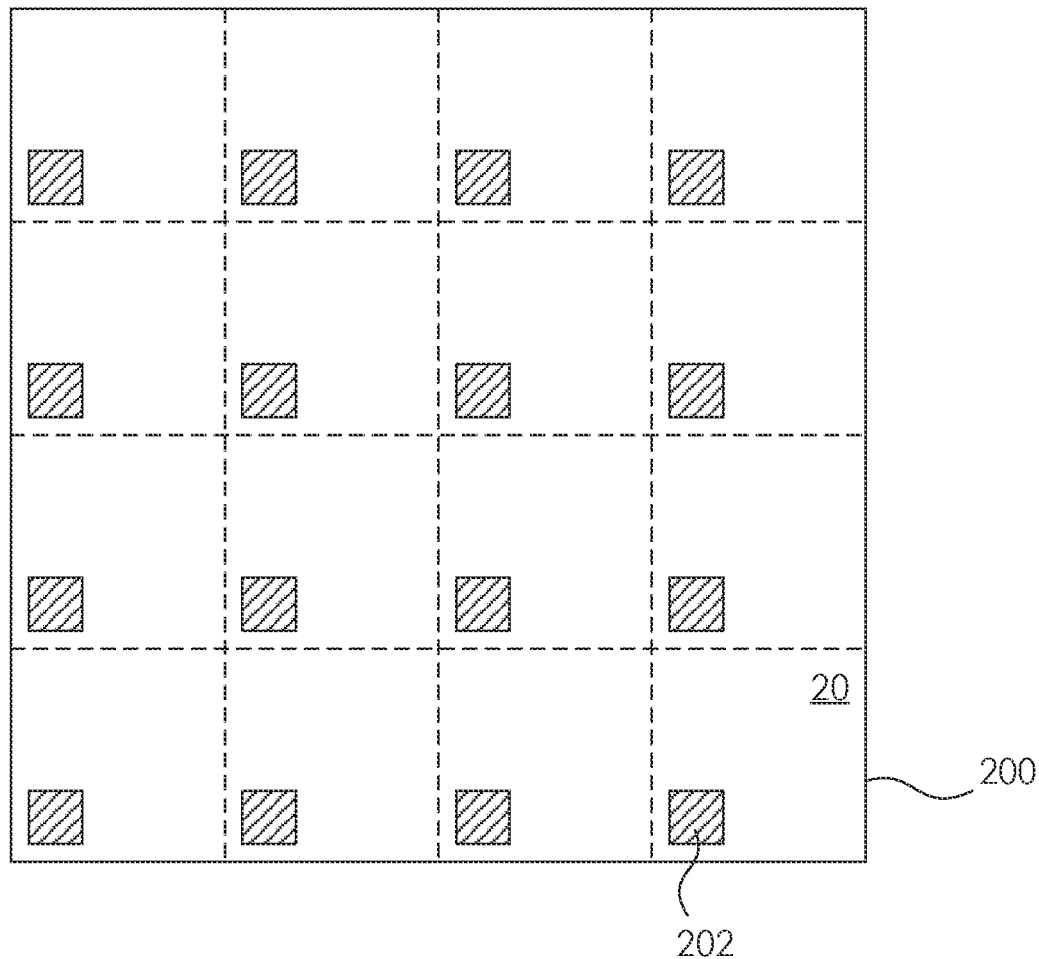
FIG. 7 illustrates a top view of a wafer according to some embodiments of the present disclosure.

Referring to the top view of the first wafer 200 in FIG. 7, in some embodiments, the first wafer 200 can include a plurality of memory structures 20, or device units, arranged in an array, while each of the memory structures 20 can include a test pad 202. The test pads 202 can also be arranged in an array and can be tested simultaneously by using a probe card.

Figure 8:
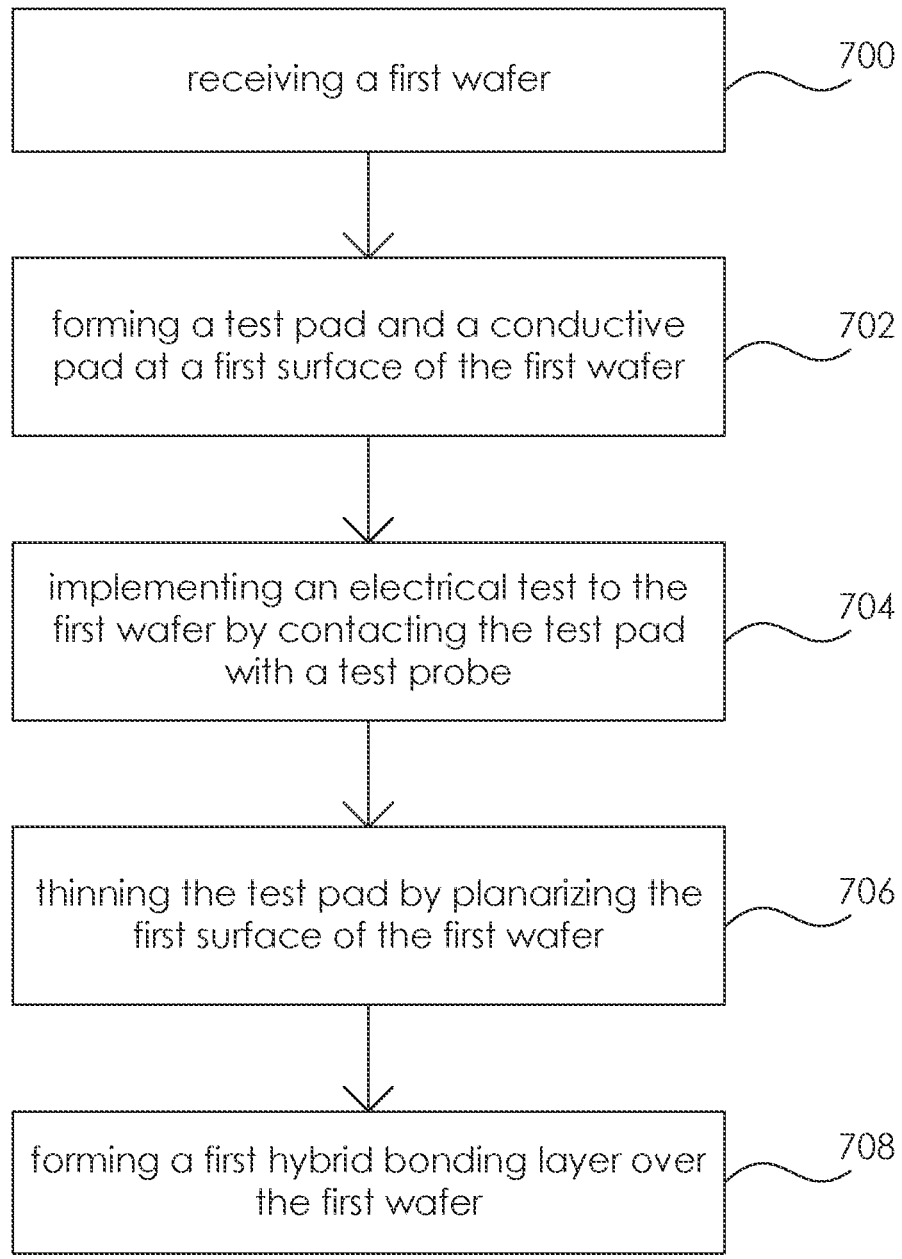
FIG. 8 illustrates a flow chart of a method for testing pre-bonded wafers according to some embodiments of the present disclosure.

According to the disclosure as abovementioned, FIG. 8 shows a flow of a method, for testing pre-bonded wafers. The method for testing pre-bonded wafers, particularly, for testing pre-hybrid-bonded wafers, can include the operations as follows: an operation 700: receiving a first wafer; an operation 702: forming a test pad and a conductive pad at a first surface of the first wafer, wherein a top surface of the test pad is leveled with the first surface of the first wafer; an operation 704: implementing an electrical test to the first wafer with contacting the test pad by a test probe; and an operation 706: thinning the test pad by planarizing the first surface of the first wafer. In the circumstances that the wafers are going to be hybrid bonded, an operation 708: forming a first hybrid bonding layer over the first wafer, can be included.

Briefly, according to the abovementioned embodiments, the electrical test still can be implemented prior to the wafer-on-wafer bonding operation or the chip-on-wafer operation once the probe mark formed by the physical contact of the test probe can be overcome. In the embodiments of the present disclosure, the depth of the probe mark can be reduced by planarizing operations such as a CMP operation or an etching operation, or an additional insulating layers or further an additional conductive pattern layer is/are formed over the test pad to cure the structural defect and thus ensure a planar surface can be provided for the bonding operation. By using the feature in the present disclosure, the electrical test to the semiconductor devices in the wafer can be implemented prior to the bonding operation, and therefore the yield and the cost control in manufacturing the semiconductor structure with wafer bonding technique can be well improved.

In one exemplary aspect, a method for bonding tested wafers is provided. The method includes the following operations. A first wafer having a first surface is received, and the first wafer includes a test pad and a conductive pad at the first surface of the first wafer and the test pad has a recess caused by a test probe and the conductive pad is electrically connected to the test pad. The first surface of the first wafer is planarized after testing the first wafer by the test probe. A first hybrid bonding layer is formed over the first surface of the first wafer. The first wafer and a second wafer are bonded to connect the first hybrid bonding layer and a second hybrid bonding layer on the second wafer.

In another exemplary aspect, a semiconductor structure is provided. The semiconductor structure includes a first wafer, a hybrid bonding structure and a second wafer. The first wafer has a first surface. The first wafer includes a first test pad and a conductive pad. The first test pad has a recess caused by a test probe. The conductive pad is leveled with the first test pad at the first surface of the first wafer, and is electrically connected to the test pad. The hybrid bonding structure is formed over the first surface of the first wafer. The second wafer is bonded over the first surface of the first wafer through the hybrid bonding structure.

In yet another exemplary aspect, a method for testing pre-bonded wafers is provided. The method includes the following operations. A first wafer is received. A test pad and a conductive pad are formed at a first surface of the first wafer, wherein top surfaces of the test pad and the conductive pad are leveled with the first surface of the first wafer, and the conductive pad is electrically connected to the test pad. An electrical test is implemented to the first wafer by contacting the test pad with a test probe. The first wafer over the test pad is thinned by planarizing the first surface of the first wafer.

The foregoing outlines structures of several embodiments so that those skilled in the art may better understand the aspects of the present disclosure. Those skilled in the art should appreciate that they may readily use the present disclosure as a basis for designing or modifying other operations and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for bonding tested wafers, the method comprising:
    receiving a first wafer having a first surface, wherein the first wafer comprises a test pad and a conductive pad at the first surface of the first wafer and the test pad has a recess caused by a test probe, and the conductive pad is electrically connected to the test pad through an interconnected structure in a back-end-of-line (BEOL) structure of the first wafer;
    planarizing the first surface of the first wafer;
    forming a first hybrid bonding layer over the first surface of the first wafer; and
    bonding the first wafer and a second wafer to connect the first hybrid bonding layer and a second hybrid bonding layer on the second wafer.

2. The method of claim 1, wherein planarizing the first surface of the first wafer comprises:
    reducing the recess at the test pad, wherein the recess is formed after testing the first wafer by the test probe.

3. The method of claim 2, wherein a depth of the recess is in a range of from about 0.1 μm to about 0.3 μm.

4. The method of claim 1, wherein planarizing the first surface of the first wafer comprises:
    forming an insulating layer over the first surface of the first wafer.

5. The method of claim 4, further comprising:
    forming a conductive pattern layer over the insulating layer prior to forming the first hybrid bonding layer.

6. The method of claim 1, wherein the first wafer comprises a memory structure, and the second wafer comprises a logic structure.

7. A semiconductor structure, comprising:
    a first wafer having a first surface, comprising:
        a first test pad having a recess caused by a test probe; and
        a conductive pad leveled with the first test pad at the first surface of the first wafer, and electrically connected to the first test pad through an interconnected structure in a back-end-of-line (BEOL) structure of the first wafer;
    a hybrid bonding structure over the first surface of the first wafer; and
    a second wafer bonded over the first surface of the first wafer through the hybrid bonding structure.

8. The semiconductor structure of claim 7, further comprising:
    a planarizing structure between the first surface of the first wafer and the hybrid bonding structure, the planarizing structure comprises:
        an insulating layer over the first surface of the first wafer, wherein the first test pad is entirely covered by the insulating layer; and
        a conductive via penetrating the insulating layer, and the conductive via is in contact with the conductive pad.

9. The semiconductor structure of claim 8, wherein the recess is formed at a top surface of the first test pad, and the recess is filled with an insulating material of the insulating layer.

10. The semiconductor structure of claim 7, wherein the second wafer comprises:

a through silicon via (TSV) electrically connects the hybrid bonding structure and a second test pad at a second surface of the second wafer away from the hybrid bonding structure.

11. The semiconductor structure of claim 7, wherein a width of the first test pad is larger than a width of the conductive pad from a cross sectional perspective.

12. The semiconductor structure of claim 11, wherein the width of the first test pad is in a range of from about 20 µm to about 60 µm.

13. The semiconductor structure of claim 9, wherein a depth of the recess at the top surface of the first test pad is less than about 0.3 µm.

14. The semiconductor structure of claim 9, wherein the top surface of the first test pad is free from contacting any conductive component of the hybrid bonding structure.

15. The semiconductor structure of claim 8, wherein the planarizing structure further comprises:
   a conductive pattern layer over the insulating layer, wherein the conductive pattern layer comprises a wiring pattern electrically connected to the conductive via and the hybrid bonding structure.

16. The semiconductor structure of claim 15, wherein the conductive pattern layer further comprises a dummy pattern projectively over the first test pad, and the dummy pattern fills in a recess of the insulating layer.

17. A method for testing pre-bonded wafers, the method comprising:
   receiving a first wafer;
   forming a test pad and a conductive pad at a first surface of the first wafer, wherein top surfaces of the test pad and the conductive pad are leveled with the first surface of the first wafer, and the conductive pad is electrically connected to the test pad through an interconnected structure in a back-end-of-line (BEOL) structure of the first wafer;
   implementing an electrical test to the first wafer by contacting the test pad with a test probe; and
   thinning the test pad by planarizing the first surface of the first wafer.

18. The method of claim 17, further comprising:
   forming an insulating layer over the first surface of the first wafer and the insulating layer entirely covers the top surface of the test pad; and
   forming a first hybrid bonding layer over the insulating layer.

19. The method of claim 17, wherein planarizing the first wafer over the test pad comprises:
   implementing an etching operation or a CMP operation to the first surface of the first wafer until a recess at the top surface of the test pad being less than about 0.3 µm.

20. The method of claim 17, wherein thinning the test pad by planarizing the first surface of the first wafer is performed after contacting the test pad with the test probe.

\* \* \* \* \*